United States Patent
Chen (10) Patent No.: US 9,590,119 B2
(45) Date of Patent: Mar. 7, 2017

(54) DECOUPLING CAPACITOR AND METHOD OF MAKING SAME

(75) Inventor: Chung-Hui Chen, HsinChu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 180 days.

(21) Appl. No.: 13/349,723

(22) Filed: Jan. 13, 2012

(65) Prior Publication Data

US 2013/0181269 A1 Jul. 18, 2013

(51) Int. Cl.
*H01L 29/94* (2006.01)
*H01L 27/02* (2006.01)
*H01L 23/522* (2006.01)
*H01L 27/06* (2006.01)

(52) U.S. Cl.
CPC ......... *H01L 29/94* (2013.01); *H01L 23/5223* (2013.01); *H01L 27/0288* (2013.01); *H01L 27/0629* (2013.01)

(58) Field of Classification Search
CPC ............. H01L 23/5222; H01L 23/5223; H01L 27/0288; H01L 27/0922; H01L 27/06; H01L 27/0629; H01L 29/94; H01L 29/945
USPC ........ 257/296, 300, 532; 438/239, 386, 393, 438/396
See application file for complete search history.

(56) References Cited

U.S. PATENT DOCUMENTS

| | | | |
|---|---|---|---|
| 7,262,951 B2 | 8/2007 | Hou et al. | |
| 7,531,379 B2* | 5/2009 | Rhodes | H01L 27/14603 257/448 |
| 7,564,103 B2* | 7/2009 | Losehand et al. | 257/376 |
| 8,080,830 B2* | 12/2011 | Sugizaki | H01L 27/1027 257/157 |
| 8,120,119 B2* | 2/2012 | Fischer et al. | 257/383 |
| 8,236,598 B2* | 8/2012 | Khadilkar et al. | 438/72 |
| 2007/0069295 A1 | 3/2007 | Kerr et al. | |
| 2010/0044789 A1* | 2/2010 | Lotfi et al. | 257/336 |
| 2010/0163872 A1 | 7/2010 | Lim | |
| 2011/0168782 A1* | 7/2011 | Bergler | H01L 23/5223 235/492 |
| 2011/0215390 A1* | 9/2011 | Kim | H01L 29/861 257/306 |
| 2012/0187494 A1* | 7/2012 | Huang | H01L 29/66174 257/368 |
| 2013/0168816 A1* | 7/2013 | Kang | H01L 28/24 257/536 |

* cited by examiner

Primary Examiner — Kevin M Picardat
(74) Attorney, Agent, or Firm — Duane Morris LLP (57) ABSTRACT

A device comprises a semiconductor substrate having first and second implant regions and an electrode above and between the first and second implant regions of a first dopant type. A contact structure is in direct contact with the first and second implant regions and the electrode. A third implant region has a second dopant type different from the first dopant type. A bulk contact is provided on the third implant.

15 Claims, 13 Drawing Sheets

DECOUPLING CAPACITOR AND METHOD OF MAKING SAME

FIELD

This disclosure relates to semiconductor integrated circuit devices and fabrication methods.

BACKGROUND

Power supply lines in a semiconductor integrated circuit (IC) supply current to charge and discharge active and passive devices in the IC. For example, digital complementary metal-oxide-semiconductor (CMOS) circuits draw current when the clock makes a transition. During the operation of circuits, the power supply lines supply transient currents with a relatively high intensity, which can result in voltage noise on the power supply lines. The voltage on the power supply line will fluctuate when the fluctuation time of the transient current is short or when its parasitic inductance or parasitic resistance is large.

The operational frequency of the IC may be on the order of several hundreds of mega-hertz (MHz) to several giga-hertz (GHz). In such circuits, the rising time of clock signals is very short, so that voltage fluctuations in the supply line may be very large. Undesired voltage fluctuations in the power supply line powering a circuit can cause noise on its internal signals and degrade noise margins. The degradation of noise margins can reduce circuit reliability or even cause circuit malfunction.

To reduce the magnitude of voltage fluctuations in the power supply lines, filtering or decoupling capacitors are usually used between the terminals of different power supply lines or between terminals of power supply line and the ground line. Decoupling capacitors act as charge reservoirs that additionally supply currents to circuits to prevent momentary drops in supply voltage.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

For advanced technologies, stricter design rules may be adopted to promote high yield. One design rule that is frequently employed is the use of a "poly-density" rule. "Poly-density" refers to the ratio of the area of gate electrode layer material to the total IC area. It has been determined that maintaining at least a minimum threshold poly-density across the IC helps prevent dishing and erosion in subsequently deposited interconnect layers.

Poly-density design rules are observed regardless of whether the gate electrode layer is formed of polycrystalline silicon or a high-k metal gate material. In the description below, unless expressly indicated to refer to semiconductor, references to "poly layer material" refers to any gate electrode layer material, regardless of whether polycrystalline silicon or metal.

In many cases, the area occupied by gate and/or capacitor electrodes in the gate electrode layer is relatively small compared to an area that meets the poly-density design rule. To meet the design rule, dummy poly layer fill material is inserted. The dummy poly layer fill is not required to be part of, or connected to, any of the active devices of the IC, and is not required to perform any logic function.

For advanced technologies (e.g., those having critical dimensions of 20 nm or smaller), slot contacts are also being considered. A slot contact is a contact having an elongated aspect ratio. For convenience, slot contact layers have the following abbreviations. M0 (metal 0) generally refers to a slot contact layer. M0_OD1 refers to an ohmic contact layer on an oxide definition doped impurity region. In some embodiments, the M0_OD1 layer is formed of copper or tungsten. M0_OD2 refers to a via or line pattern layer formed directly on the M0_OD1 layer. The M0_OD2 layer may include any combination of contact vias extending to the first metal layer and/or line patterns. In some embodiments, the M0_OD2 layer is formed of copper or tungsten. M0_PO refers to a slot contact layer formed directly on the gate electrode layer. In some embodiments, the M0_PO layer is formed of tungsten.

In some embodiments described below, the M0_OD1, M0_OD2, and M0_PO layers are used to build dummy patterns that are included in decoupling capacitors. Various configurations of decoupling capacitors can be used. Thus, conductive material in the M0 layer(s) performs a dual function: serving as dummy fill to improve the lithography process for subsequent layers, and to provide decoupling capacitors. By performing both of these functions with the same patterns, the IC area is used more efficiently, leaving more space open for functional circuitry, or permitting reduction in the total IC area. For example, in an IC having 15% dummy fill area and 40% decoupling capacitor poly density, the techniques described herein may reduce the total area occupied by dummy fill and decoupling capacitors by up to 12%.

In some embodiments, a decoupling capacitor is constructed using an NMOS, PMOS, or CMOS process, by forming a MOSFET structure having source and drain regions, a gate insulating layer and a gate electrode; connecting the source, drain and gate by contacts and interconnections in the M1 (metal 1) or other line layer. In other embodiments, the source, drain and gate are connected by a single contact structure in a 1-step M0 layer. In other embodiments, the source, drain and gate are connected by a contact structure in a 2-step structure using the M0_OD1, M0_OD2, and M0_PO layers.

In some embodiments devices (e.g., NMOS or varactors in an P well or PMOS in a N well) are connected by a contact structure in the M0_OD2 layer, where the contact structure spans across multiple active regions in a channel length direction to connect the gates above each active region together. In other embodiments device are connected by a contact structure in the M0_OD2 layer, where the contact structure spans across multiple active regions perpendicular to the channel length direction to connect the active region together.

Figure 1:
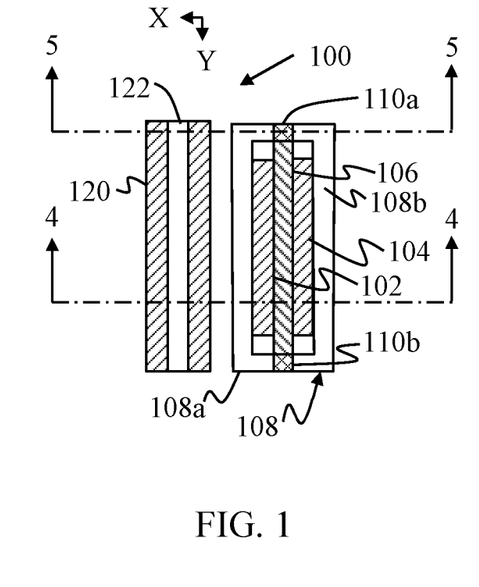
FIG. 1 is a plan view of a single decoupling capacitor cell configured to be arranged in columns.
Figure 2:
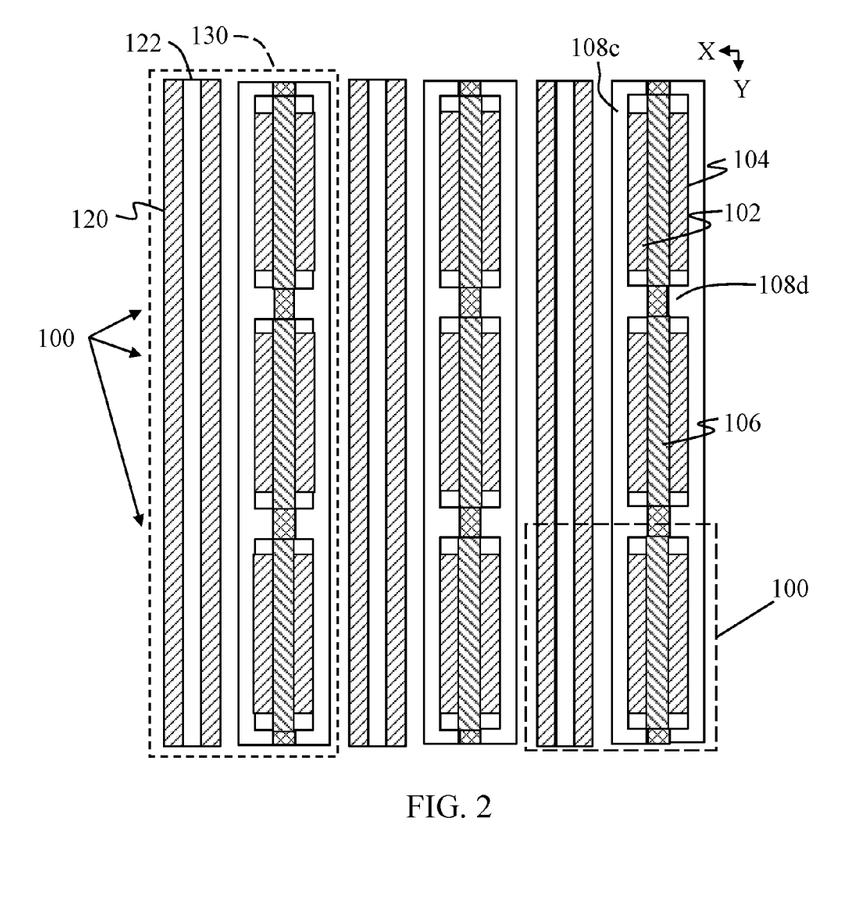
FIG. 2 is a plan view of an array of decoupling capacitors of the type shown in FIG. 1.
Figure 3:
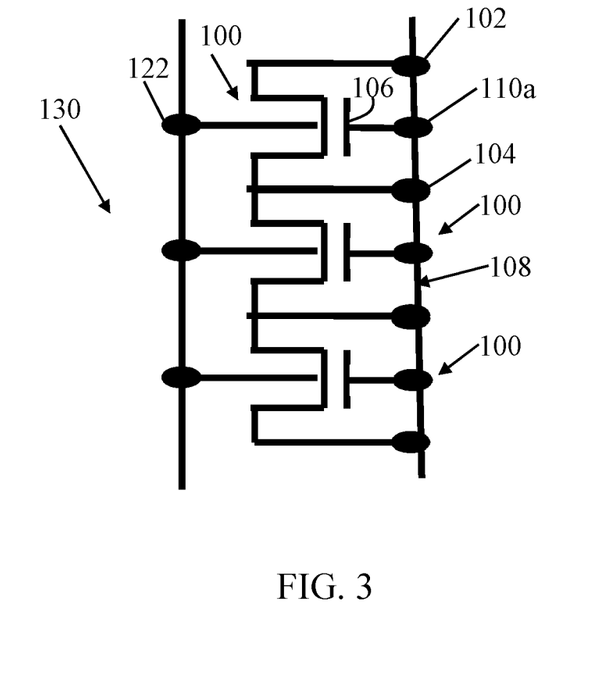
FIG. 3 is a schematic of a decoupling capacitor shown in FIG. 2.
Figure 4A:
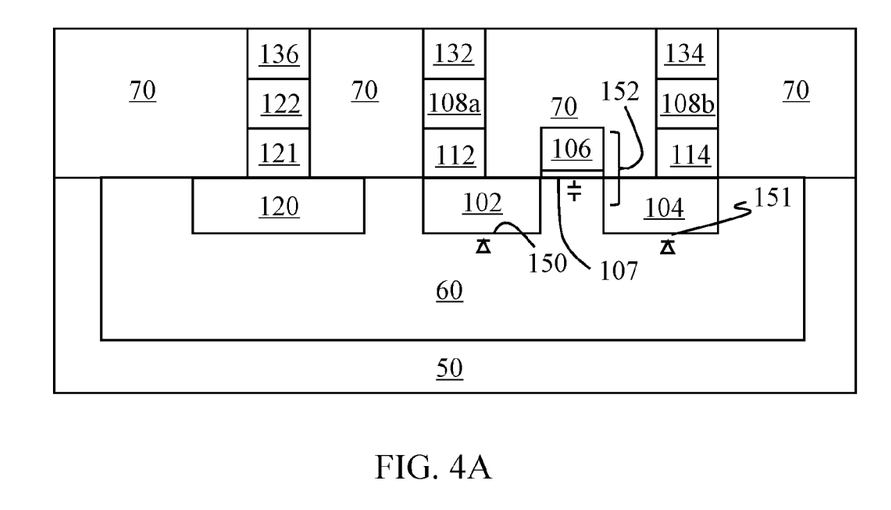
FIG. 4A is a cross-sectional view taken along section line 4-4 of FIG. 1.
Figure 4B:
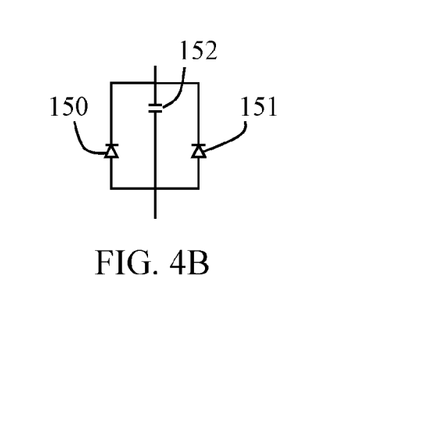
FIG. 4B is a partial schematic of a detail of FIG. 4A.
Figure 5:
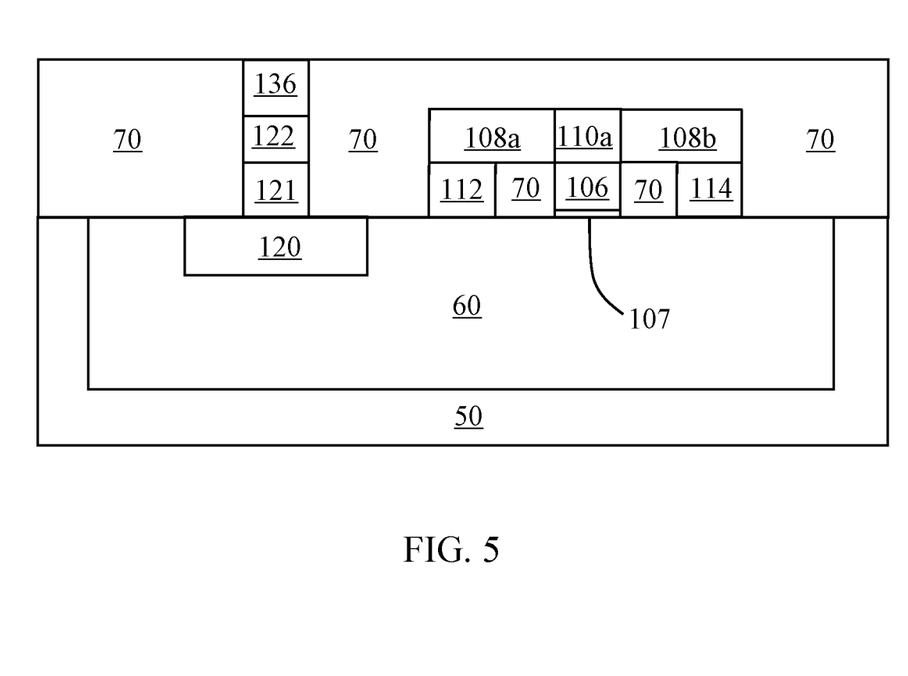
FIG. 5 is a cross-sectional view taken along section line 5-5 of FIG. 1.

FIGS. 1-5 show a first embodiment of a device 100, at the completion of front end of line (FEOL) processing. This processing includes fabrication of the active device layers, contacts, dielectric, and first metal (M1) layer. The device 100 is a decoupling capacitor, which may be provided as a single cell (FIG. 1) or as an array of plural cells (FIG. 2). FIG. 4A is a cross-sectional view taken along section line 4-4 of FIG. 1. FIG. 5 is a cross-sectional view taken along section line 5-5 of FIG. 1. In FIGS. 1 and 2, the M1 (metal 1) layer patterns are omitted for ease of viewing the underlying contacts.

Referring first to FIGS. 1, 4 and 5, the decoupling capacitor 100 comprises a semiconductor substrate 50. Substrate 50 can be a silicon substrate, a III-V compound substrate, a silicon/germanium (SiGe) substrate, a silicon-on-insulator (SOI) substrate, a display substrate such as a liquid crystal display (LCD), a plasma display, an electro luminescence (EL) lamp display, or a light emitting diode (LED) substrate, according to various exemplary embodiments.

Substrate 50 has an P-well 60, with a first implant region 102 and second implant region 104, an insulating layer 107 and an electrode 106 above and between the first and second implant regions 102, 104.

The implant regions (also referred to as active regions) 102, 104 are provided by doping a region of the substrate 50 with impurities. The implant regions 102, 104 are of a first dopant type. For example, in an NMOS embodiment, well 60 is doped with P type dopants, implant regions 102 and 104 are N+ impurity regions, and bulk contact implant 120 is a P+ type implant region.

In some embodiments, the insulating layer 70 is the same layer used for forming the gate insulating layer 107 of transistors on the same substrate 50. In embodiments, which do not use a high-k metal gate process, insulating layer 70 is a silicon oxide gate insulating layer. In other embodiments, the insulating layer 70 comprises a high-K dielectric, such as, but not limited to, a hafnium based oxide, a hafnium based oxynitride, or a hafnium-silicon oxynitride, hafnium silicate, zirconium silicate, hafnium dioxide and zirconium dioxide. The high-k dielectric layer 70 may include a binary or ternary high-k film such as HfO, LaO, AlO, ZrO, TiO, Ta 2 O 5, Y 2 O 3, STO, BTO, BaZrO, HfZrO, HfLaO, HfTaO, HfTiO, combinations thereof, or other suitable materials. Alternatively, the high-k dielectric layer 70 may optionally include a silicate such as HfSiO, LaSiO, AlSiO, combinations thereof. The insulating layer 70 may be deposited using atomic layer deposition.

The electrode 106 is formed in the same layer as the gate electrode of transistors formed in functional circuitry on the same IC. In some embodiments, which do not use a high-k metal gate process, the electrode 106 may be polycrystalline silicon. In embodiments which use a high-k metal gate process, the electrode 106 is a metal or alloy, such as but not limited to, titanium nitride, tantalum nitride, or aluminum nitride.

A contact structure 108 is provided in direct contact with the first and second implant regions 102, 104 and the gate electrode 106. As shown in FIGS. 1, 4 and 5, the contact structure 108 includes a rectangular ring in the M0_OD2 layer having portions 108a, 110a, 108b, and 110b. and ohmic contacts 112, 114 in the M0_OD1 layer. The ohmic contacts 112, 114 may be elongated slot contacts, or round or square contacts.

In some embodiments, the contact structure 108 includes a rectangle having a plurality of slot contacts. A first one of the slot contacts 112 directly contacts the first implant region 102. A second one of the slot contacts 114 directly contacts the second implant region 104. In some embodiments, the contacts 112, 114 have a length that is approximately the width of the active regions 102, 104. In other embodiments, the slot contacts 112, 114 are shorter than a width of the active regions 102, 104. the contact structure includes:

A third contact 110a and a fourth contact 110b directly contacts the gate electrode 106 outside of the first and second implant regions 102, 104. A left side of the rectangle 108a is formed in the M0-OD2 layer, and abuts the left surfaces of contacts 110a, 110b. A right side of the rectangle 108b is formed in the M0-OD2 layer, and abuts the right surfaces of contacts 110a, 110b. As best seen in FIG. 5, the M0_OD1 layer contacts 112, 114 are about the same height as the gate electrode layer in which electrode 106 is formed. Thus, the ring portions 108a, 108b, in the M0_OD2 layer are formed directly on the respective contacts 112, 114, and the ring portions 110a, and 110b in the M0_PO layer are formed directly on the electrode 106. The top and bottom portions of the rectangle 108 thus form slot contacts extending parallel to a channel length direction (X direction in FIG. 1), and the slot contacts are located outside of the first and second implant regions 102, 104.

In some embodiments, the contacts 112, 114 in the M0_OD1 layer are sputtered or evaporated metal pads patterned using photolithography, to provide low-resistance, and stability for the performance and reliability. For a silicon substrate, examples of suitable contact materials for contact portion 121 include W, Al, Al—Si, $TiSi_2$, TiN, $MoSi_2$, PtSi, $CoSi_2$, $WSi_2$. In some embodiments, the M0_OD2 layer is made of the same material as the M0_OD1 layer. In other embodiments, the M0_OD1 layer is made of tungsten or copper.

A third implant region 120 has a second dopant type different from the first dopant type. In the example of FIGS.

1-5, region 120 is a P-type implant region. The third implant has a bulk contact 122 thereon.

Also shown in FIGS. 4 and 5 are the M1 layer interconnect patterns 132, 134 for the cathode 102, 104 of the device 100, and the M1 interconnect pattern 136 for the anode of the device.

In some embodiments, as shown in FIG. 2, the device 100 is included in a plurality of devices on the substrate 50. The plurality of devices 100 are arranged in a column 130 along a channel length (X) direction. In FIG. 2, multiple devices 100 are arranged in columns 130. Each column has two or more devices 100. The active layers and the M0_OD1 layer of each device 100 in FIG. 2 are the same as discussed above with reference to FIGS. 1, 4 and 5. In the M0_OD2 layer, respective rectangular contact structures 108 for vertically adjacent devices 100 are merged together, to span plural devices. The plurality of devices are arranged in the Y direction, perpendicular to the channel length (X) direction. The third implant region 120 and bulk contact 122 are extended in the Y direction, perpendicular to the channel length (X) direction along each of the plurality of devices. A single bulk contact 122 extends along the full length of the column of devices 100. Larger decoupling capacitance can be achieved by adding further columns 130, each column including a plurality of devices 100 and a bulk contact 122 with its implant region 120. The contact structure 108 includes at least one slot contact (top and bottom portions of 108a, 108b, and M0_PO layer portions 110a, 110b) extending parallel to a channel length direction (X). These slot contacts are located outside of the first and second implant regions 102, 104.

FIG. 3 is a schematic view of one column of the devices 100. As shown in FIG. 3, the source 102, drain 104 and "gate" electrode 106 are tied together by conductor 108, and are conductively connected to the source, drain and gate of the other decoupling capacitors 100 by conductor 108. The channel side of the gate is coupled to the bulk connector 122. Thus, a capacitor 152 (FIG. 4A) is formed between the electrode 106 and the bulk semiconductor 50.

Additionally, as shown in FIG. 4B, two p-n junction diodes (FIG. 4A) are formed: a diode 150 comprising the N+ implant region 102 and bulk 50, and a diode 151 comprising the N+ implant region 104 and bulk 50. Thus, the semiconductor substrate 50 has first and second p-n junction diodes 150, 151, each having a diode contact 112, 114; and a MOS capacitor 152 adjacent the first and second p-n junction diodes 150, 151. The MOS capacitor 152 has a capacitor contact 110a connected to the diode contact 112, 114 of each of the first and second diodes by the contact structure 108 and a bulk contact 122 in a first implant region 120 near at least one of the diodes 150.

The first implant region 120 has a dopant type of a first dopant type; and each p-n junction diode 150, 151 has a second implant region 102, 104 of a second dopant type opposite the first dopant type. Each second implant region 102, 104 is within a well 60 having a dopant type different from the first dopant type. For an NMOS embodiment (FIGS. 1-5), well 60 is a P well, implants 102, 104 are N+ implants, and implant 120 is a P+ implant. For a PMOS embodiment (FIGS. 6-8), well 60 is an N well, implants 102, 104 are P+ implants, and implant 120 is a N+ implant.

Figure 6:
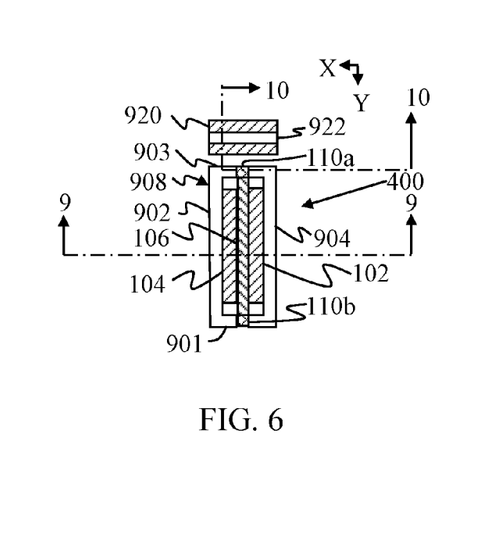
FIG. 6 is a plan view of a single decoupling capacitor configured to be arranged in rows.
Figure 7:
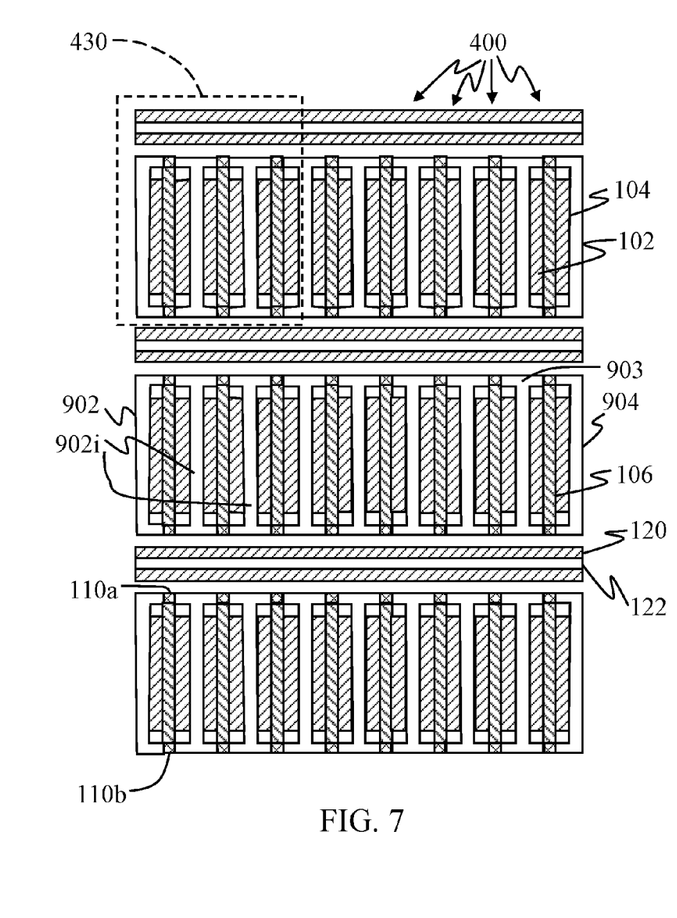
FIG. 7 is a plan view of an array of decoupling capacitors of the type shown in FIG. 6.
Figure 8:
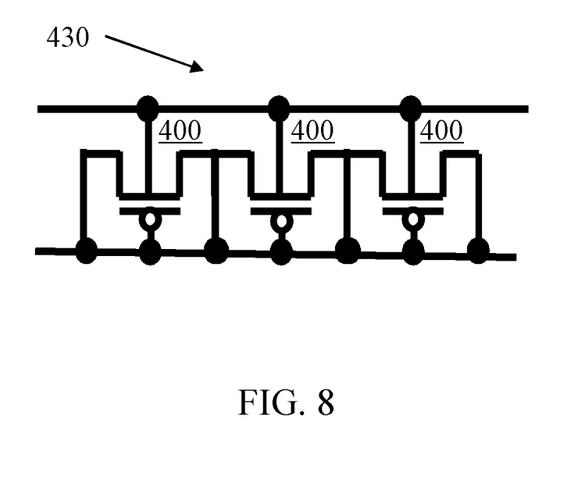
FIG. 8 is a schematic of a decoupling capacitor shown in FIG. 7.

FIGS. 6-8 show a second arrangement of the decoupling capacitor, configured for arrangement in horizontal rows (instead of vertical columns). Like items are indicated by like reference numerals. For an individual device, the cross sections of the implant regions 102, 104 and conductor 106 are the same as shown in FIGS. 4 and 5, and descriptions are not repeated.

In FIG. 6, the third implant region 120 and bulk contact 122 extend lengthwise in the channel length (X) direction along each of the plurality of devices 400. This configuration may be used in layouts where a long horizontal space is available for the decoupling capacitors. As shown in FIG. 7, a larger number of devices 400 fit into a given two-dimensional area, with a smaller bulk contact area per device (relative to the configuration of FIGS. 1-5.

Figure 9:
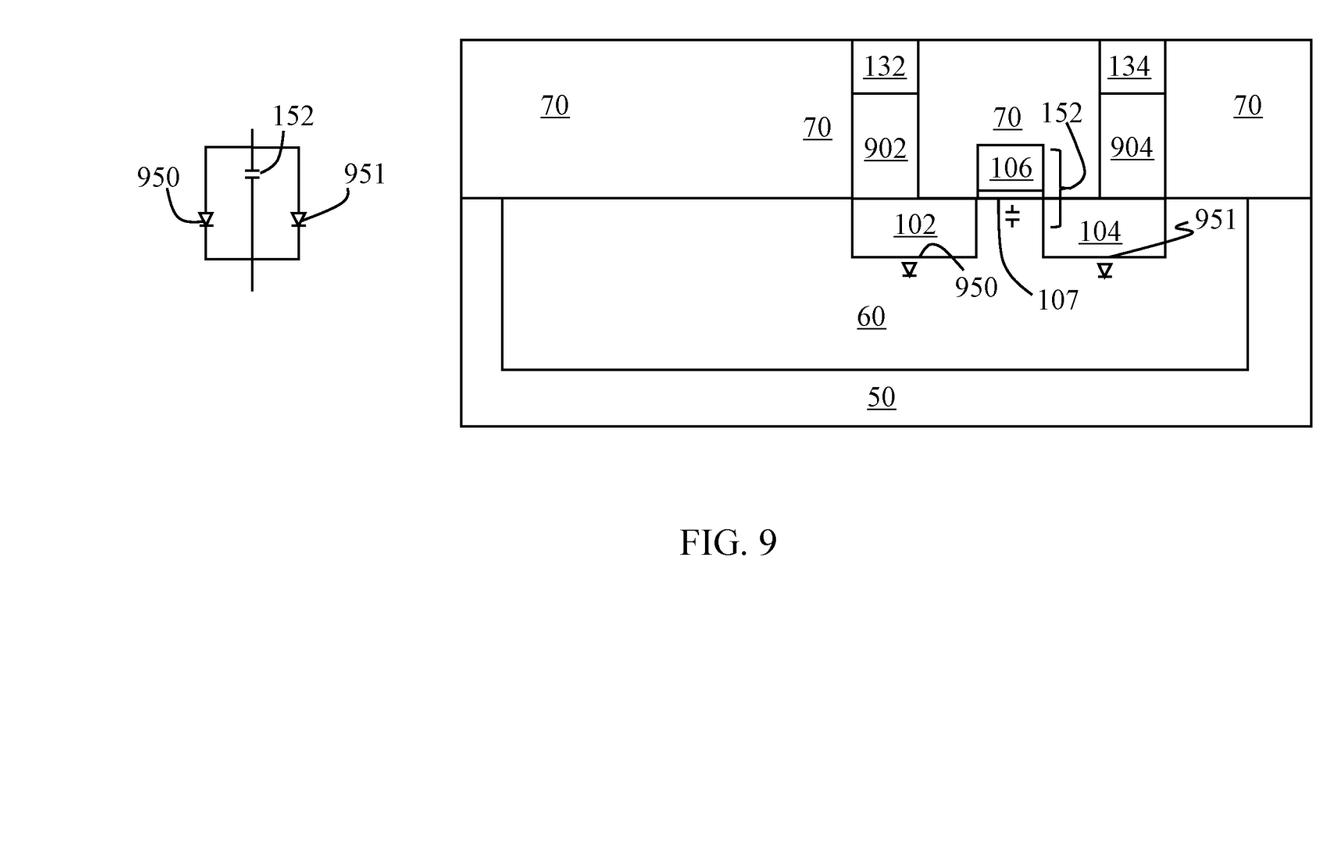
FIGS. 9 and 10 are alternate cross-sectional views of a decoupling capacitor having a single M0 contact layer, also taken along section lines 4-4 and 5-5 of FIG. 1, respectively.
Figure 10:
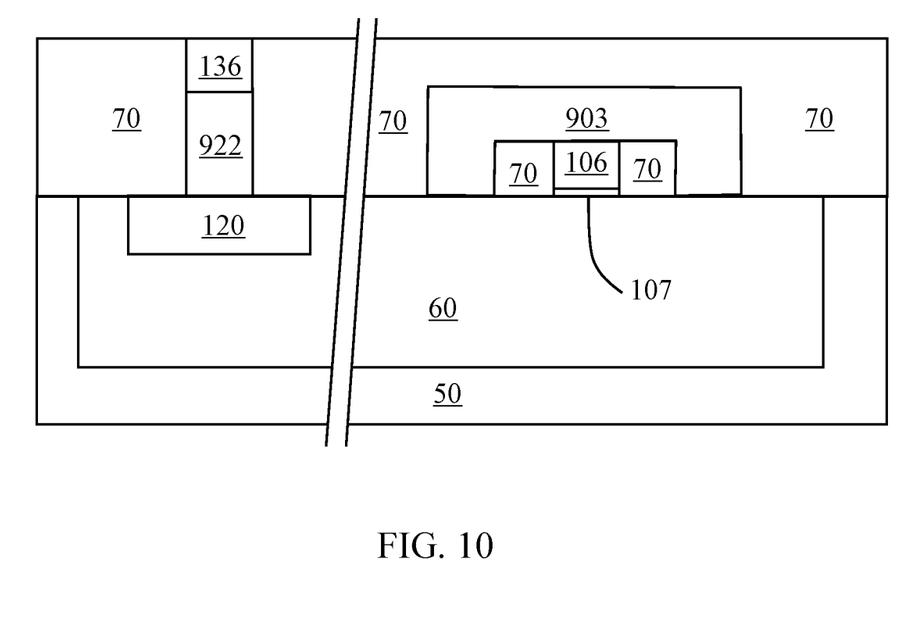

As shown in FIG. 8, which is a schematic of the detail 430 of FIG. 7, the devices are essentially configured the same as in FIG. 3, except that FIG. 8 shows PMOS transistors. Thus, as shown in FIGS. 9 and 10, the implant regions 102, 104 of device 400 are N+ implant regions in a P-well 60. The bulk contact implant 120 is an P+ implant. This is only by way of example. The vertical column arrangement of FIGS. 1 and 2 may also be implemented in PMOS, and the horizontal arrangement of FIGS. 6 and 7 may also be implemented in NMOS.

FIGS. 9 and 10 are cross sectional views of the device 400 taken along section lines 9-9 and 10-10 respectively, in FIG. 6. FIGS. 9 and 10 show an additional feature of this embodiment which differs from FIGS. 4 and 5. In FIGS. 9 and 10, a single contact layer M0 is provided, extending all the way from the surface of the substrate 50 to the bottom of the M1 layer 132, 134, 136. The contact structure 908 is filled in a single step. The contact vias 901, 902, 903, 904 and 922 and the contact portions 110a, 110b are all filled in a single metal fill step. Thus, the contact structure is a continuous layer of metal which contacts the substrate (portions 901, 903), implant regions (portions 902, 904, 922) and contacts the gate electrode layer (portions 110a, 110b). One of ordinary skill in the art may select either the one or two layer contacts as a part of the process design. Further, although the one-layer contact is shown with a horizontal arrangement of capacitors, in a PMOS embodiment, the one layer contact may be used with the vertical arrangement and/or NMOS or varactors. Similarly, a two layer contact embodiment may be used with a horizontal arrangement and/or PMOS or varactors.

Based on the available space, and desired decoupling capacitance, one of ordinary skill can readily select the vertical columnar arrangement of FIGS. 1-5 or the horizontal row configuration of FIGS. 6-10, and select the number of rows or columns and the number of devices per row or column.

Figure 11:
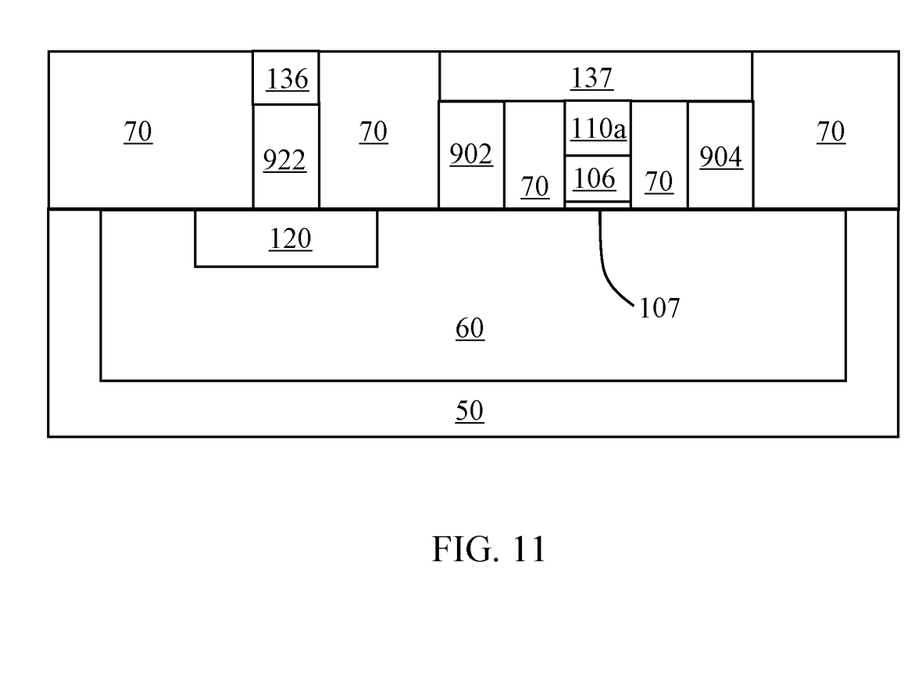
FIG. 11 is an alternate cross-sectional view of a decoupling capacitor having a single M0 contact layer with a coupling in the M1 layer, also taken along section line 5-5 of FIG. 1.

FIG. 11 shows another variation of the capacitor. FIG. 11 is an alternative cross-sectional view taken along section line 4-4 of FIG. 1. That is, a capacitor having the cross section of FIG. 11 may have the same plan view shown in FIG. 1 (FIG. 1 omits the M1 layer for ease of understanding, so differences in the M1 layer do not appear in FIG. 1).

FIG. 11 shows the top and bottom ends of the rectangular contact structure. FIG. 11 shows a single M0 layer, which extends from the substrate up to the bottom of the M1 layer. In this variation, the top and bottom edges of the rectangular structure include contacts 110a and 110b formed directly on the electrode 106. Contacts 902, 904 and 110a all extend directly upward. Rather than including horizontal connecting portions in the M0 layer, the slot contacts 902 and 904 are connected to the M0-PO contact 110a by patterns 137 in the M1 layer.

Figure 12:
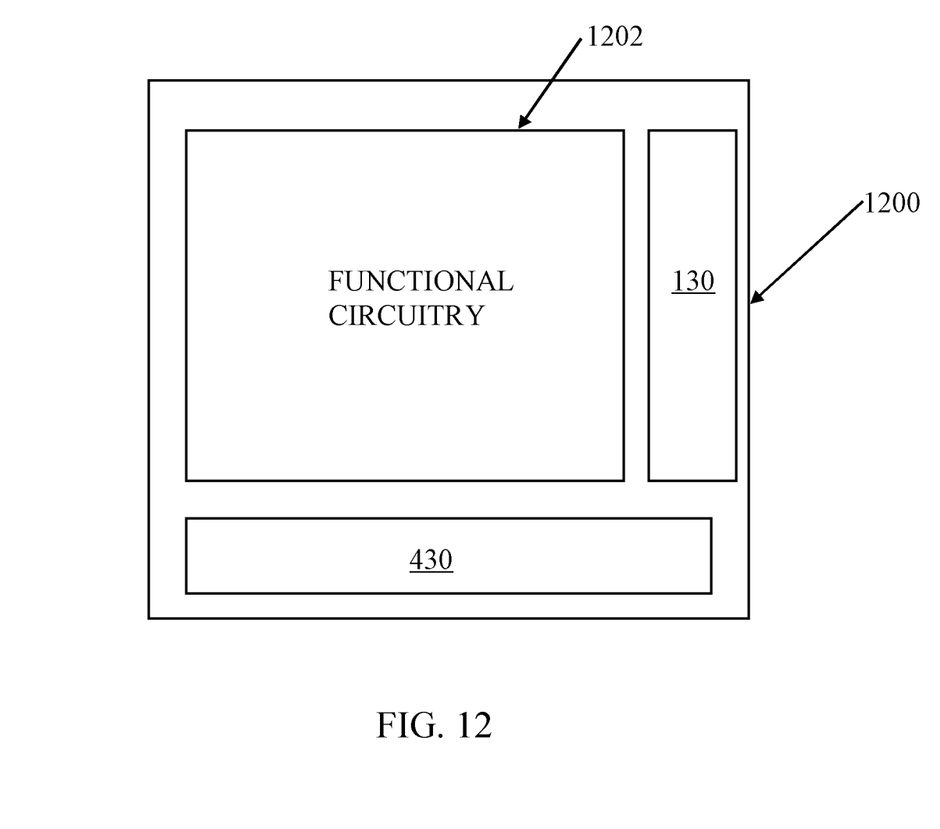
FIG. 12 is a schematic sketch of a layout of an IC, including a row and a column of decoupling capacitors.

FIG. 12 is a schematic diagram of an layout in which an IC 1200 has a functional circuitry area 1202, a column 130 of decoupling capacitors 100, one or more rows 430 of decoupling capacitors 400 and one or more columns 130 of decoupling capacitors 100. This is just one example, and a variety of IC layouts may include any number of rows of capacitors 100 and/or any number of columns of capacitors 400. Although FIG. 12 shows the decoupling capacitors all segregated in a contiguous portion of the floor plan, the capacitors may be arranged in plural rows and/or plural columns that are separated from each other.

Figure 13:
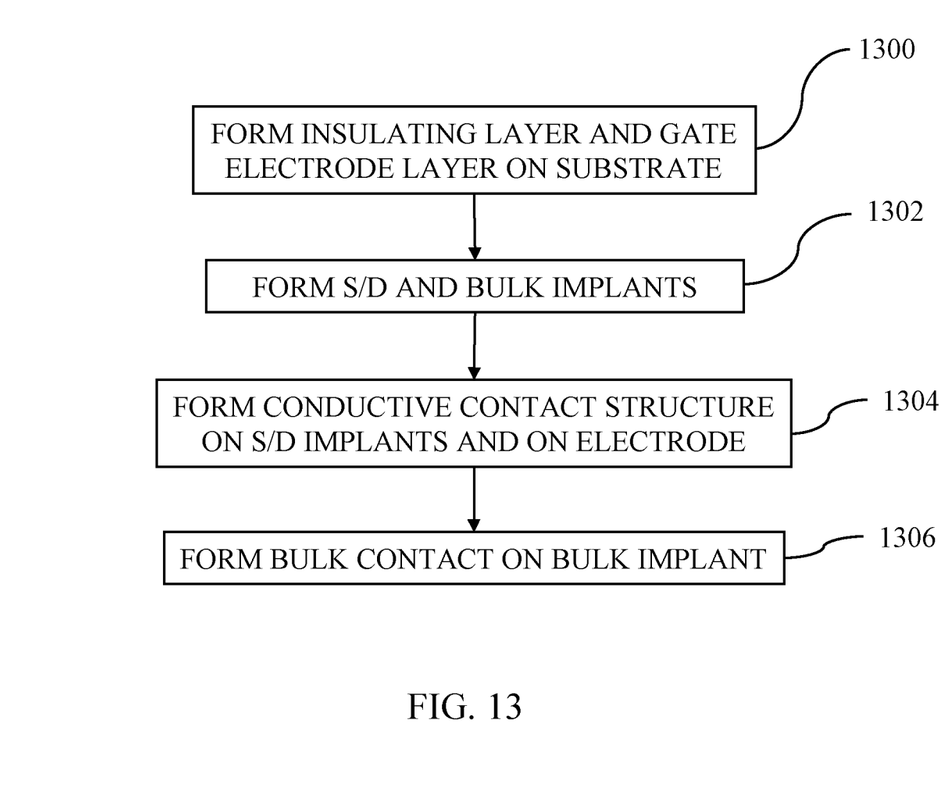
FIG. 13 is a flow chart of a first example of a method of making a capacitor.

FIG. 13 is a first non-limiting example of a method of making a capacitor.

At step 1300, an insulating layer and an electrode are formed above and between first and second implant regions of a first dopant type in a surface of a semiconductor substrate.

At step 1302, source (first), drain (second) and bulk implant regions are formed on the substrate. The third implant region has a different dopant type from the first dopant type.

At step 1304, a conductive contact structure is formed on the first and second implant regions. The conductive structure has an additional portion overlying a portion of the electrode.

At step 1306, a bulk contact is formed on the bulk (third) implant region in the surface.

Figure 14:
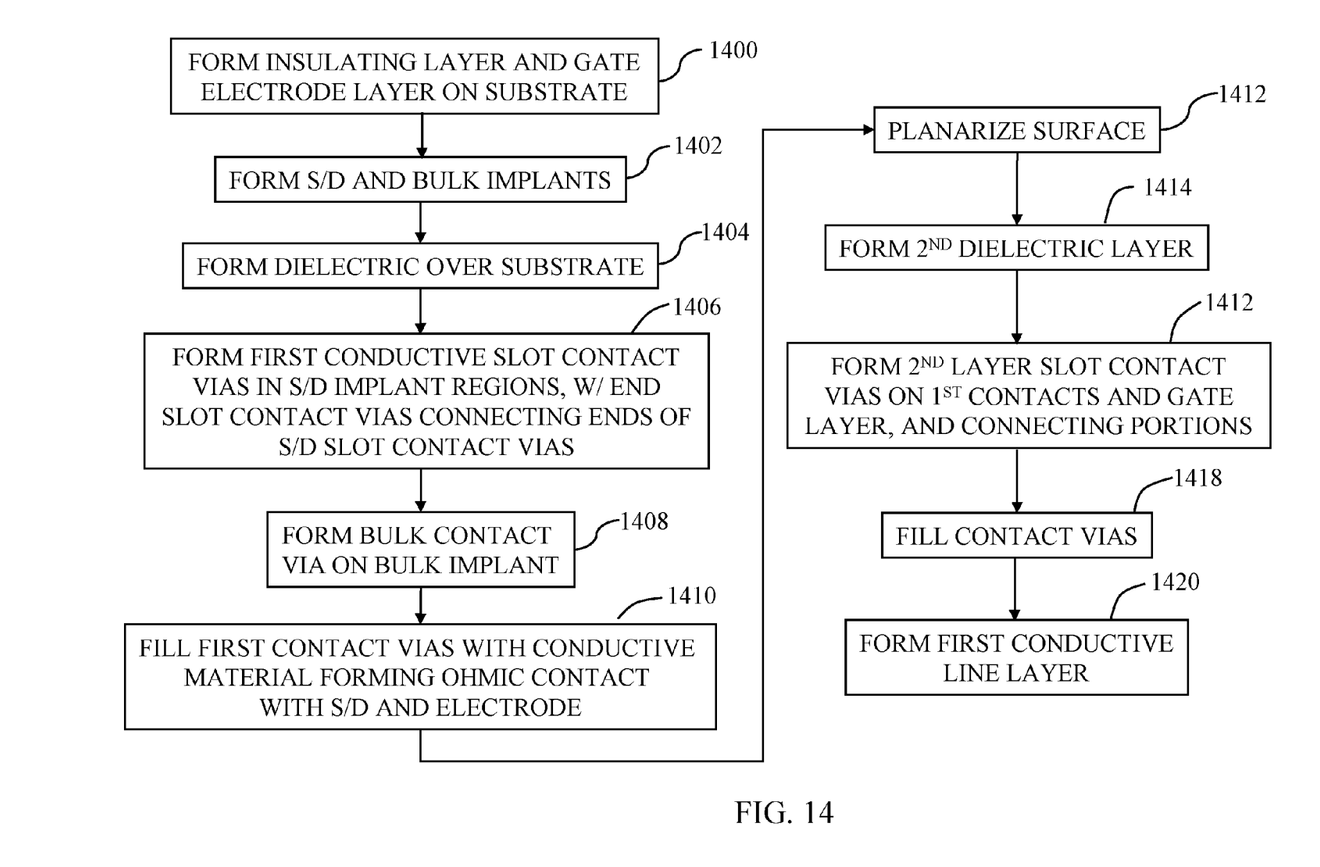
FIG. 14 is a flow chart of a second example of a method of making a capacitor.

FIG. 14 is a flow chart of a second example of a method for making a decoupling capacitor.

At step 1400, an insulating layer and an electrode are formed above and between first and second implant regions of a first dopant type in a surface of a semiconductor substrate.

At step 1402, source (first), drain (second) and bulk implant regions are formed on the substrate. The third implant region has a different dopant type from the first dopant type.

At step 1404, a dielectric layer is formed over the substrate. The first dielectric layer has a height greater than the top surface of the gate electrode layer.

At step 1406, first conductive slot contact vias are formed in the first dielectric layer, extending to the first and second implant regions, respectively. At least a third slot contact via is formed in the first dielectric layer extending to a portion of the top surface of the electrode. In some embodiments, two third slot contact vias are formed in the first dielectric layer extending to an opposite end of the top surface of the electrode. In some embodiments, the bulk slot contact via is also patterned at this time.

At step 1408, the bulk contact via is formed in the second dielectric layer, thus forming a fourth slot contact in the first dielectric layer, extending to the third (bulk) implant region at the same time the first (source) and second (drain) slot contact vias are formed.

At step 1410, in some embodiments, at the conclusion of step 1408, the first contact vias are filled with a conductive material capable of forming an ohmic contact with a semiconductor material, thus filling the bulk slot contact via with the conductive material at the same time the source, drain and connecting slot contact vias are filled.

At step 1412, the substrate is planarized, so the top of the dielectric, MO-OD1 layer and gate electrode layer are the same.

At step 1414, a second dielectric layer (for the MD-OD2 layer) is deposited over the first dielectric layer. The second dielectric layer will extend up to the M1 layer.

At step 1416, the second layer contact vias are formed, extending from a top of the contacts in the MD-OD1 layer and from the gate electrode layer to the M1 layer. In some embodiments, this via is in the form of a rectangular ring extending across the source and drain implant regions, and having end portions which overly and extend beyond the gate electrode in a direction parallel to the channel length direction.

At step 1418 the first, second and third slot contact vias are filled with a material such as tungsten or copper, thus forming a continuous conductive second contact pattern on the first contacts and on the portion of the electrode.

At step 1420, a first conductive line layer M1 is formed in the second dielectric layer as part of a front end of line process. The first conductive line layer has connections to the contact structure and the bulk contact.

Although the details of FIG. 14 are provided for an embodiment having both MD_OD1 and MD-OD2 contact via layers, in other embodiments, the two layers of contact vias are formed first, and then both contact via layers are filled with a material capable of forming an contact ohmic contact with the semiconductor, to reduce the number of process steps.

In some embodiments, a device comprises a semiconductor substrate having first and second implant regions and a gate electrode above and between the first and second implant regions of a first dopant type. A contact structure is in direct contact with the first and second implant regions and the gate electrode. A third implant region has a second dopant type different from the first dopant type. The third implant has a bulk contact thereon.

In some embodiments, a decoupling capacitor comprises a semiconductor substrate having first and second p-n junction diodes, each having a diode contact. A MOS capacitor is adjacent the first and second p-n junction diodes. The MOS capacitor has a capacitor contact connected to the diode contact of each of the first and second diodes and a bulk contact in a first implant region near at least one of the diodes.

In some embodiments, a method of making a capacitor comprises: forming an insulating layer and an electrode above and between first and second implant regions of a first dopant type in a surface of a semiconductor substrate; forming a conductive contact structure on the first and second implant regions, the conductive structure having an additional portion overlying a portion of the electrode, and forming a bulk contact on a third implant region in the surface, the third implant region having a different dopant type from the first dopant type.

Although the subject matter has been described in terms of exemplary embodiments, it is not limited thereto. Rather, the appended claims should be construed broadly, to include other variants and embodiments, which may be made by those skilled in the art.

What is claimed is:

1. A device, comprising:
a semiconductor substrate having first and second implant regions and an electrode above and between the first and second implant regions of a first dopant type;
a contact structure in direct contact with the first and second implant regions and the electrode; and
a third implant region having a second dopant type different from the first dopant type, the third implant having a bulk contact thereon,
wherein:
the contact structure includes at least one slot contact extending parallel to a channel length direction, and
the at least one slot contact is located outside of the first and second implant regions such that the at least one slot contact is positioned laterally from the first and second implant regions.

2. The device of claim 1, wherein the device is a decoupling capacitor.

3. The device of claim 1, wherein the slot contact directly contacts the electrode.

4. The device of claim 1, wherein:
the contact structure includes a rectangle having a plurality of slot contacts;
a first one of the slot contacts directly contacts the first implant region;
a second one of the slot contacts directly contacts the second implant region; and
third and fourth contacts directly contact the electrode outside of the first and second implant regions.

5. The device of claim 1, wherein the contact structure includes:
a first contact layer in direct contact with the first and second implant regions;
a second contact layer on the first contact layer; and
a contact portion on the electrode.

6. The device of claim 1, wherein the device is included in a plurality of devices on the substrate, the plurality of devices arranged along a channel length direction; and
the third implant region and bulk contact extend lengthwise in the channel length direction along each of the plurality of devices.

7. The device of claim 1, wherein:
the device is included in a plurality of devices on the substrate, the plurality of devices arranged perpendicular to a channel length direction;
the contact structure extends perpendicular to the channel length direction, and connects implant regions of the plurality of devices; and
the third implant region and bulk contact extend perpendicular to the channel length direction along each of the plurality of devices.

8. A method of making a capacitor, comprising:
forming an insulating layer and an electrode above and between first and second implant regions of a first dopant type in a surface of a semiconductor substrate;
forming a conductive contact structure on the first and second implant regions, the conductive structure having an additional portion overlying a portion of the electrode, and
forming a bulk contact on a third implant region in the surface, the third implant region having a different dopant type from the first dopant type,
wherein:
the contact structure includes at least one slot contact extending parallel to a channel length direction, and
the at least one slot contact is located outside of the first and second implant regions such that the at least one slot contact is positioned laterally from the first and second implant regions.

9. The method of claim 8, wherein the step of forming the conductive contact structure includes:
forming first conductive contacts on the first and second implant regions; and
forming a continuous conductive second contact pattern on the first contacts and on the portion of the electrode.

10. The method of claim 9, wherein the second contact pattern has a rectangle shape with a respective side of the rectangle overlying each respective one of the first and second implant regions.

11. The method of claim 10, wherein the second conductive pattern has two sides which overlie respective portions of the electrode.

12. The method of claim 9, wherein the first conductive contacts are formed of tungsten and the second contact layer is formed of tungsten or copper.

13. The method of claim 8, wherein the step of forming the conductive contact structure includes:
forming a first dielectric layer over the substrate and the electrode layer;
forming first and second slot contact vias in the first dielectric layer, extending to the first and second implant regions, respectively;
forming at least a third slot contact via in the first dielectric layer extending to a top of the electrode;
filling the first, second and third slot contact vias with a conductive material capable of forming an ohmic contact with a semiconductor material.

14. The method of claim 13, wherein the step of forming the bulk contact includes:
forming a fourth slot contact in the first dielectric layer, extending to the third implant region at the same time the first and second slot contact vias are formed; and
filling the fourth slot contact via with the conductive material at the same time the first, second, and third slot contact vias are filled.

15. The method of claim 14, further comprising:
forming a second dielectric layer over the first, second, third and fourth slot contact vias; and
forming a first conductive line layer in the second dielectric layer as part of a front end of line process, the first conductive line layer having connections to the contact structure and the bulk contact.

* * * * *